United States Patent
Maeda

(10) Patent No.: US 9,859,442 B2
(45) Date of Patent: Jan. 2, 2018

(54) METAL OXIDE SEMICONDUCTOR LAYER FORMING COMPOSITION, AND METHOD FOR PRODUCING METAL OXIDE SEMICONDUCTOR LAYER USING SAME

(71) Applicant: NISSAN CHEMICAL INDUSTRIES, LTD., Tokyo (JP)

(72) Inventor: Shinichi Maeda, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/325,842

(22) PCT Filed: Jul. 14, 2015

(86) PCT No.: PCT/JP2015/070204
§ 371 (c)(1),
(2) Date: Jan. 12, 2017

(87) PCT Pub. No.: WO2016/010052
PCT Pub. Date: Jan. 21, 2016

(65) Prior Publication Data
US 2017/0162699 A1    Jun. 8, 2017

(30) Foreign Application Priority Data

Jul. 16, 2014  (JP) ................................. 2014-146105
Mar. 12, 2015  (JP) ................................. 2015-049862

(51) Int. Cl.
| C01G 15/00 | (2006.01) |
| H01L 29/786 | (2006.01) |
| C09D 5/24 | (2006.01) |
| C09D 1/00 | (2006.01) |

(Continued)

(52) U.S. Cl.
CPC .......... *H01L 29/7869* (2013.01); *C01G 15/00* (2013.01); *C09D 1/00* (2013.01);
(Continued)

(58) Field of Classification Search
CPC ............................ C01G 15/00; H01L 29/7869
USPC ........................................................ 257/43
See application file for complete search history.

(56) References Cited

U.S. PATENT DOCUMENTS

2002/0132911 A1* 9/2002 Rietz ....................... C07C 17/12
                                                              524/577
2003/0129421 A1* 7/2003 Terauchi .............. C08G 18/283
                                                              428/447

(Continued)

FOREIGN PATENT DOCUMENTS

| JP | H11-158427 A | 6/1999 |
| JP | 2010-258018 A | 11/2010 |

(Continued)

OTHER PUBLICATIONS

Oct. 20, 2015 Search Report issued in International Patent Application No. PCT/JP2015/070204.

*Primary Examiner* — Jami M Valentine
(74) *Attorney, Agent, or Firm* — Oliff PLC

(57) ABSTRACT

The invention provides a metal oxide semiconductor layer forming composition containing a solvent represented by formula [1]:

[F1]

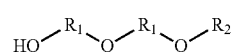

[1]

(wherein $R_1$ represents a C2 to C3 linear or branched alkylene group, and $R_2$ represents a C1 to C3 linear or branched alkyl group) and an inorganic metal salt.

16 Claims, 7 Drawing Sheets

(51) Int. Cl.
*H01L 21/02* (2006.01)
*H01L 29/66* (2006.01)
*H01L 29/24* (2006.01)

(52) U.S. Cl.
CPC .......... *C09D 5/24* (2013.01); *H01L 21/02565* (2013.01); *H01L 21/02623* (2013.01); *H01L 21/02664* (2013.01); *H01L 29/24* (2013.01); *H01L 29/66969* (2013.01); *C01P 2006/40* (2013.01)

(56) References Cited

U.S. PATENT DOCUMENTS

| | | | | |
|---|---|---|---|---|
| 2006/0234901 | A1* | 10/2006 | Scheuing | C11D 1/004 510/475 |
| 2013/0099213 | A1* | 4/2013 | Jun | C09K 11/02 257/40 |
| 2015/0094436 | A1* | 4/2015 | Kawai | C08G 61/126 526/240 |
| 2016/0005932 | A1* | 1/2016 | Lee | C09K 11/02 257/98 |
| 2017/0080397 | A1* | 3/2017 | Ishigure | B82Y 30/00 |
| 2017/0178961 | A1* | 6/2017 | Ryu | H01L 21/0215 |

FOREIGN PATENT DOCUMENTS

| | | |
|---|---|---|
| JP | 2012-174718 | 9/2012 |
| JP | 2013-197539 | 9/2013 |
| JP | 2014-003068 | 1/2014 |
| JP | 2014-011190 A | 1/2014 |

\* cited by examiner (a)

(b)

(c)

METAL OXIDE SEMICONDUCTOR LAYER FORMING COMPOSITION, AND METHOD FOR PRODUCING METAL OXIDE SEMICONDUCTOR LAYER USING SAME

TECHNICAL FIELD

The present invention relates to a composition for forming a metal oxide semiconductor layer through a coating method, to a metal oxide semiconductor layer produced through the method, to a method for producing the metal oxide semiconductor layer, and to a field-effect transistor and a semiconductor device each having the metal oxide semiconductor layer.

BACKGROUND ART

There have been disclosed a technique for forming a transparent conductive film from a composition containing indium nitrate (see Patent Document 1), and a technique for forming a metal oxide semiconductor layer from a composition containing indium nitrate (see Patent Document 2).

Such a transparent conductive film and a metal oxide semiconductor layer have a conducting property. However, an important aspect of the conducting property required for the metal oxide semiconductor layer is mobility, and that for the transparent conductive film is conductivity.

Conductivity is defined as a product of mobility and carrier concentration. Thus, when the carrier concentration is high, high conductivity can be attained even if the mobility is low. Also, in the case where difficulty is encountered in enhancing conductivity, satisfactory current can be obtained when the thickness of the transparent conductive film increases. The effect is equivalent to enhancement in conductivity. Under such circumstances, efforts are made on improvement mainly focusing on formation of a thick transparent conductive film.

On the other hand, layer thickness is not important for a metal oxide semiconductor layer. Actually, when the metal oxide semiconductor layer has a thickness of about 10 nm, satisfactory performance can be attained. In contrast, when the layer thickness is excessively large, mobility may be impaired due to cracking of the layer or the like. Thus, it is desired to attain high mobility by a thin film having a thickness of about 10 nm. Since the metal oxide semiconductor layer exhibits excellent performance when the thickness is small, surface roughness, which is not problematic for transparent conductive film, may considerably affect the semiconductor characteristics. This is a main problem to be solved in the case of a metal oxide semiconductor.

More specifically, in the case where a high-performance metal oxide semiconductor layer is formed through a coating technique, satisfactory performance of a metal oxide semiconductor layer fails to be attained, if a conventional transparent conductive film forming composition is used without any improvement.

Patent Document 1 discloses a transparent conductive film formed from indium nitrate and a carbitol. However, mobility and roughness of the film are not evaluated, and the document is silent to application of the transparent conductive film to a metal oxide semiconductor layer. In addition, the difference in characteristics between ethylene glycol and a carbitol is not described.

Patent Document 2 discloses a metal oxide semiconductor formed of indium nitrate and ethyl carbitol. In Patent Document 2, ethylene glycol monomethyl ether and propylene glycol monomethyl ether are described as particularly preferred solvents. A liquid mixture containing such a solvent can attain excellent semiconductor characteristics. However, the present inventor carried out a reproducing test and, as a result, a film obtained from the metal oxide semiconductor was found to be readily provided with pinholes, and to have considerable roughness, which are problematic. Furthermore, in Patent Document 2, the coated substrate is heat-treated (dried) at relatively high temperature (100° C.). From an industrial viewpoint, drying the substrate at high temperature is not practical, and drying at a temperature lower than 100° C. is preferred. However, drying at lower temperature may result in a rise in surface roughness.

As described above, a low-boiling-point solvent such as propylene glycol monomethyl ether is not a suitable solvent, in that the solvent causes to generation of pinholes in the film. A high-boiling-point solvent such as ethylene glycol provides improved film-formability, but readily remains in the film. As a result, difficulty is encountered in forming a metal oxide semiconductor film having excellent mobility. Thus, there has never been developed a metal oxide semiconductor layer forming composition which can provide a flat metal oxide semiconductor film with high mobility and no pinhole.

PRIOR ART DOCUMENTS

Patent Documents

Patent Document 1: Japanese Patent Application Laid-Open (kokai) No. 1999-158427
Patent Document 2: Japanese Patent Application Laid-Open (kokai) No. 2014-11190

SUMMARY OF THE INVENTION

Problems to be Solved by the Invention

An object of the present invention is to provide a metal oxide semiconductor layer forming composition which can provide a flat metal oxide semiconductor layer with high mobility and no pinhole. Another object is to provide a metal oxide semiconductor layer, a thin-film transistor, and a device from the composition.

Means for Solving the Problems

The present inventor has carried out extensive studies and has found that a metal oxide semiconductor forming composition containing a solvent represented by formula [1] can provide a particularly excellent effect.

Accordingly, in a first mode of the present invention, there is provided a metal oxide semiconductor layer forming composition, characterized by comprising a solvent represented by formula [1]:

[F1]

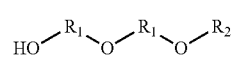

[1]

(wherein $R_1$ represents a C2 to C3 linear or branched alkylene group, and $R_2$ represents a C1 to C3 linear or branched alkyl group) and an inorganic metal salt.

A second mode is directed to a specific embodiment of the metal oxide semiconductor layer forming composition according to the first mode, wherein the inorganic metal salt is an inorganic indium salt.

A third mode is directed to a specific embodiment of the metal oxide semiconductor layer forming composition according to the second mode, wherein the inorganic metal salt is indium nitrate.

A fourth mode is directed to a specific embodiment of the metal oxide semiconductor layer forming composition according to any one of the first to third modes, wherein the solvent represented by formula [1] is at least one species selected from the group consisting of dipropylene glycol monomethyl ether, dipropylene glycol monoethyl ether, and dipropylene glycol monopropyl ether.

A fifth mode is directed to a specific embodiment of the metal oxide semiconductor layer forming composition according to any one of the first to fourth modes, which contains the solvent represented by formula [1] in an amount of 1 to 39 mass %.

A sixth mode is directed to a specific embodiment of the metal oxide semiconductor layer forming composition according to any one of the first to fifth modes, which contains a primary amide in an amount of 1 to 1,000 mass %, with respect to the amount of the inorganic metal salt.

In a seventh mode of the present invention, there is provided a method for producing a metal oxide semiconductor layer, the method comprising step (a) of applying a metal oxide semiconductor layer forming composition as recited in any one of the first to sixth modes, to thereby form a precursor thin film, and step (b) of firing the precursor thin film at 150° C. to 350° C.

An eighth mode is directed to a specific embodiment of the metal oxide semiconductor layer production method according to the seventh mode, wherein the method further includes, between steps (a) and (b), a step of drying the precursor thin film at 120° C. or lower.

In a ninth mode of the present invention, there is provided a metal oxide semiconductor layer produced through a metal oxide semiconductor layer production method as recited in any either of the seventh and eighth modes.

In a tenth mode of the present invention, there is provided a semiconductor device having a metal oxide semiconductor layer as recited in the ninth mode.

In an eleventh mode of the present invention, there is provided a field-effect transistor having at least a substrate, a semiconductor layer, a source electrode, and a drain electrode, wherein the semiconductor layer is a metal oxide semiconductor layer as recited in the ninth mode.

In a twelfth mode of the present invention, there is provided a method for producing a metal oxide conductor layer, which method comprises, after steps (a) and (b) as recited in the seventh mode, step (c) of firing a metal oxide semiconductor layer at a temperature higher than 350° C. and 600° C. or lower, to thereby convert the metal oxide semiconductor layer to a metal oxide conductor layer.

A thirteenth mode is directed to a specific embodiment of the metal oxide conductor layer production method according to the twelfth mode, wherein the method further includes, between steps (a) and (b), a step of drying the precursor thin film at 120° C. or lower.

Effects of the Invention

By use of the metal oxide semiconductor layer forming composition of the present invention, a flat metal oxide semiconductor layer with high mobility and no pinhole can be provided. The thin-film transistor having the metal oxide semiconductor layer of the present invention exhibits excellent characteristics.

MODES FOR CARRYING OUT THE INVENTION

Figure 1:
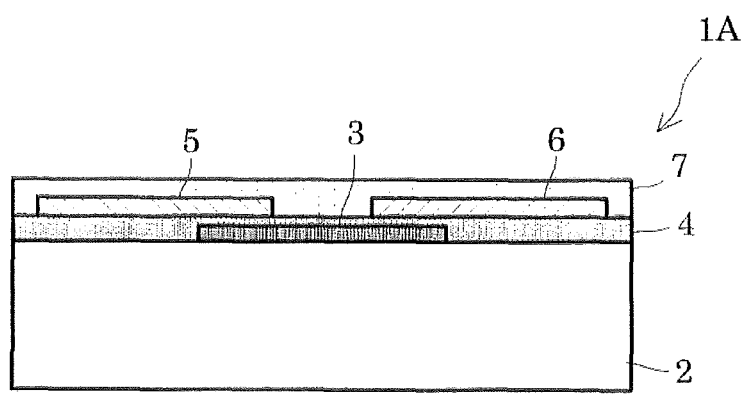
FIG. 1 Schematic cross-sections of thin-film transistors 1A to 1C
Figure 1:
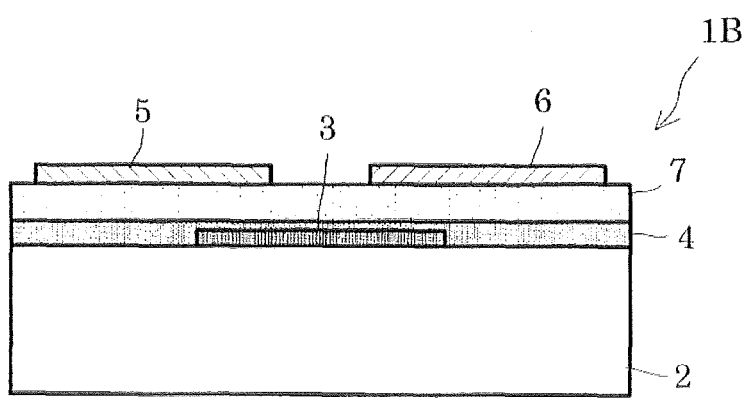
Figure 1:
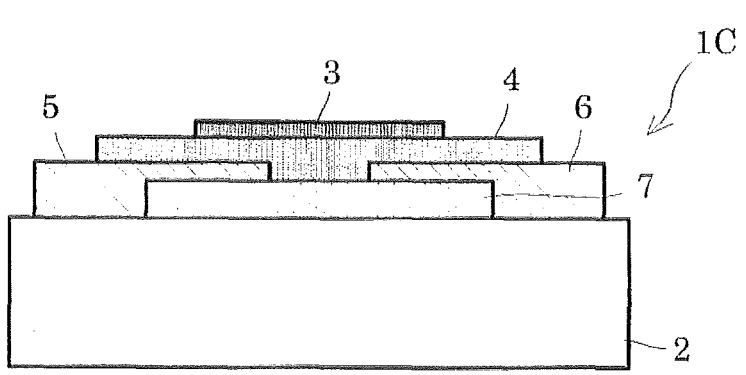

The present invention is directed to a metal oxide semiconductor layer forming composition, characterized by comprising a solvent selected from the compounds represented by formula [1]:

[F2]

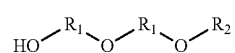

[1]

(wherein $R_1$ represents a C2 to C3 linear or branched alkylene group, and $R_2$ represents a C1 to C3 linear or branched alkyl group) and an inorganic metal salt.

The composition of the present invention contains a solvent represented by formula [1]:

[F3]

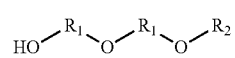

[1]

(wherein $R_1$ represents a C2 to C3 linear or branched alkylene group, and $R_2$ represents a C1 to C3 linear or branched alkyl group). The solvent represented by formula [1] has high boiling point and can be mixed with an inorganic metal salt at high concentration. The solvent prevents growth of pinholes during application of coating liquid and enables formation of a flat metal oxide semiconductor layer. Furthermore, the solvent does not readily remain as impurity in the metal oxide semiconductor layer.

When $R_1$ or $R_2$ has too many carbon atoms, the solvent encounters difficulty in mixing with an inorganic metal salt, thereby readily causing film formation failure during application of coating liquid. Specific examples of the solvent represented by formula [1] include diethylene glycol monomethyl ether (formula S-1), diethylene glycol monoethyl ether (S-2), diethylene glycolmonopropyl ether (S-3), dipropylene glycol monomethyl ether (S-4), dipropylene glycol monoethyl ether (S-5), and dipropylene glycol monopropyl ether (S-6). Examples of preferred solvents represented by formula [1] include dipropylene glycol monomethyl ether (S-4), dipropylene glycol monoethyl ether (S-5), and dipropylene glycol monopropyl ether (S-6), with dipropylene glycol monomethyl ether (S-4) being particularly preferred. Notably, the carbon chain is preferably branched.

[F4]

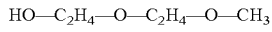     S-1

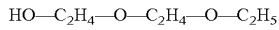     S-2

HO—C₂H₄—O—C₂H₄—O—C₃H₇    S-3
HO—C₃H₆—O—C₃H₆—O—CH₃    S-4
HO—C₃H₆—O—C₃H₆—O—C₂H₅    S-5
HO—C₃H₆—O—C₃H₆—O—C₃H₇    S-6

In addition to the inorganic metal salt and the solvent represented by formula [1], the metal oxide semiconductor layer forming composition of the present invention may further contain an additional organic solvent other than the solvent of formula [1], water, an additive, etc. When the amount of the solvent represented by formula [1] is excessively small, the effects of the invention fail to be attained. Thus, the amount of the solvent is preferably 1 mass % or more, with respect to the amount of the metal oxide semiconductor layer forming composition. In order to fully attain the effects, the solvent amount preferably 5 mass % or more, particularly preferably 8 mass % or more. Also, when the solvent represented by formula [1] is contained in an excessive amount, the inorganic metal salt concentration excessively decreases, to thereby impede formation of a suitable coating film. Therefore, the amount of the solvent is preferably 39 mass % or less, with respect to the amount of the metal oxide semiconductor layer forming composition, preferably 35 mass % or less, more preferably 25 mass % or less, particularly preferably 19 mass % or less.

The organic solvent other than solvents represented by formula [1] is preferably a protic solvent, with an alcohol being particularly preferred. Specific examples include [B-1] to [B-18] and [C-1] to [C-17].

These organic solvents can prevent film formation failure during application of the metal oxide semiconductor layer forming composition to form a precursor thin film.

[F5]

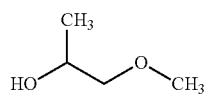 [B-1]

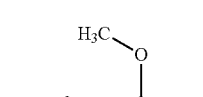 [B-2]

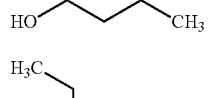 [B-3]

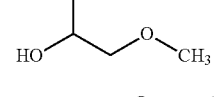 [B-4]

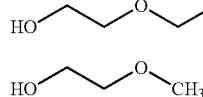 [B-5]

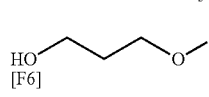 [B-6]

[F6]

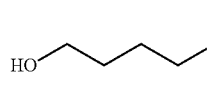 [B-7]

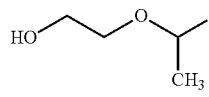 [B-8]

-continued

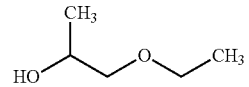 [B-9]

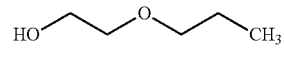 [B-10]

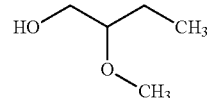 [B-11]

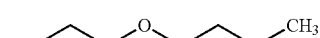 [B-12]

[F7]

 [B-13]

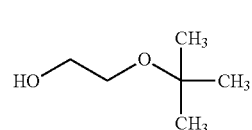 [B-14]

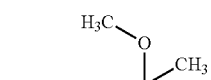 [B-15]

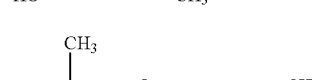 [B-16]

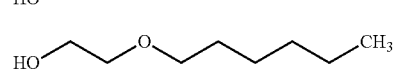 [B-17]

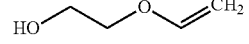 [B-18]

[F8]

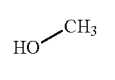 [C-1]

 [C-2]

 [C-3]

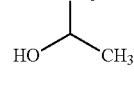 [C-4]

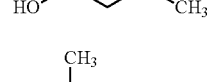 [C-5]

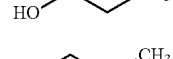 [C-6]

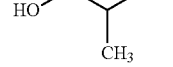 [C-7]

[F9] -continued

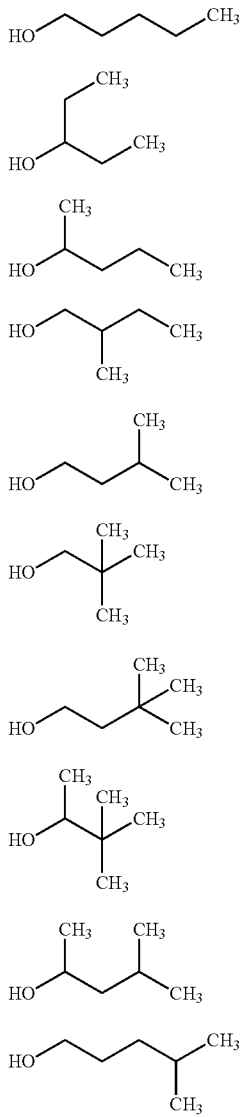

[C-8]
[C-9]
[C-10]
[C-11]
[C-12]
[C-13]
[C-14]
[C-15]
[C-16]
[C-17]

[B-1] is propylene glycol monomethyl ether. [B-2] is 1,3-butanediol 3-monomethyl ether. [B-3] is 1,2-butanediol 1-monomethyl ether. [B-4] is ethylene glycol monoethyl ether. [B-5] is ethylene glycol monomethyl ether. [B-6] is 1,3-propanediol monomethyl ether. [B-7] is 1,4-butanediol monomethyl ether. [B-8] is ethylene glycol monoisopropyl ether. [B-9] is 1,2-propanediol 1-monoethyl ether. [B-10] is ethylene glycol monopropyl ether. [B-11] is 1,2-butanediol 2-monomethyl ether. [B-12] is ethylene glycol monobutyl ether. [B-13] is ethylene glycol isobutyl ether. [B-14] is ethylene glycol mono-tert-butyl ether. [B-15] is 3-methoxy-3-methyl-1-butanol. [B-16] is propylene glycol monobutyl ether. [B-17] is ethylene glycol monohexyl ether. [B-18] is ethylene glycol monovinyl ether.

[C-1] is methanol. [C-2] is ethanol. [C-3] is n-propanol. [C-4] is isopropanol. [C-5] is n-butanol. [C-6] is 2-butanol. [C-7] is 2-methylpropyl alcohol. [C-8] is n-pentanol. [C-9] is 3-pentanol. [C-10] is 2-pentanol. [C-11] is 2-methyl-1-butanol. [C-12] is 3-methyl-1-butanol. [C-13] is 2,2-dimethyl-1-propanol. [C-14] is 3,3-dimethyl-1-butanol. [C-15] is 3,3-dimethyl-2-butanol. [C-16] is 4-methyl-2-pentanol. [C-17] is 4-methyl-1-pentanol.

The metal oxide semiconductor layer forming composition of the present invention may contain water. Examples of water preferably employed in the invention include pure or ultrapure water species such as ion-exchange water, ultrafiltration water, reverse osmotic water, and distilled water.

The metal oxide semiconductor layer forming composition of the present invention contains an inorganic metal salt. The metal of the inorganic metal salt is preferably at least one species selected from the group consisting of Li, Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Cd, In, Ir, Sn, Sb, Cs, Ba, La, Hf, Ta, W, Tl, Pb, Bi, Ce, Pr, Nd, Pm, Eu, Gd, Tb, Dy, Ho, Er, Tm, Yb, and Lu.

Among the above metal elements, the metal of the inorganic metal salt preferably includes any of indium (In), tin (Sn), and zinc (Zn), with gallium (Ga) or aluminum (Al) being more preferably included. By virtue of the selection of the metal, there can be produced a metal oxide semiconductor layer formed of a metal oxide such as indium gallium zinc oxide ($InGaZnO_x$), indium gallium oxide ($InGaO_x$), indium tin zinc oxide ($InSnZnO_x$), gallium zinc oxide ($GaZnO_x$), indium tin oxide ($InSnO_x$), indium zinc oxide ($InZnO_x$), tin zinc oxide ($SnZnO_x$), zinc oxide (ZnO), or tin oxide ($SnO_2$). Notably, in each case, x is greater than 0.

Generally, in the case where a semiconductor compound is employed in a field-effect transistor or the like, the semiconductor compound is preferably amorphous in crystallinity, from the viewpoints of electrical properties, physical strength, etc. Thus, when an amorphous metal oxide semiconductor layer is formed by use of the aforementioned inorganic metal salt of interest, a semiconductor device (e.g., field-effect transistor) having excellent characteristics can be fabricated. As used herein, the term "amorphous" refers to a case in which no diffraction peak is detected in X-ray diffractometry (XRD) or merely a weak diffraction peak is detected in X-ray diffractometry (XRD).

Such an inorganic metal salt is preferably an inorganic acid salt. The inorganic acid salt which may be employed in the invention is, for example, at least one species selected from the group consisting of a nitrate salt, a sulfate salt, a phosphate salt, a carbonate salt, a hydrogencarbonate salt, a borate salt, a hydrochloride, and a hydrofluoride. Particularly, the inorganic acid salt employed herein is preferably at least one species selected from the group consisting of a nitrate salt and a hydrochloride. By virtue of the selection, firing can be performed at relatively low temperature.

In the case where a nitrate salt is used as an inorganic metal salt, the employable organic solvent has a small molecular weight and low hydrophobicity. As a result, a nitrate salt which can readily absorb water can be suitably mixed with an organic solvent of interest. Thus, the inorganic metal salt may be selected in consideration of the type and characteristics of the organic solvent.

So long as the gist of the present invention is not changed, no particular limitation is imposed on the inorganic metal salt. The above-exemplified inorganic metal salts may be used singly or in combination of two or more species. When two or more inorganic metal salts are used in combination (i.e., in the case where the metal oxide semiconductor layer forming composition of the present invention contains a plurality of metals), metal A, metal B, and metal C preferably satisfy the relationship (mole ratio): metal A:metal B:metal C=1:0.05 to 1:0 to 1, wherein metal A is a metal included in an In or Sn salt, metal B is a metal included in Zn salts, and metal C is a metal included in an Ga or Al salt.

As a result, a metal oxide semiconductor layer such as the aforementioned InGaZnO$_x$ can be suitably formed.

No particular limitation is imposed on the method of realizing the mole ratio. Metal nitrate salts or the like are dissolved in a solvent at target mole proportions. In the case where the mole proportions vary before and after firing or the like (e.g., sublimation of metal), the mole proportions may be adjusted in consideration of such variation. Even in the case where two or more metal salts are used in combination, the type and compositional proportions of the metals are not limited to the above examples.

The metal oxide semiconductor layer forming composition of the present invention may further contain, as an optional component, a primary amide. By virtue of the presence of a primary amide, a metal oxide semiconductor layer exhibiting higher mobility can be produced. Through incorporation of the primary amide, coordination of an organic solvent to the metal salt in the metal oxide semiconductor layer forming composition is conceivably suppressed.

In other words, when the metal oxide semiconductor layer forming composition of the present invention contains an organic solvent, the organic solvent strongly coordinates to the metal salt. As a result, a high-quality semiconductor layer may fail to be formed through firing at high temperature. However, through incorporation of the primary amide into the precursor composition, the adverse effect of the organic solvent can be prevented, whereby a high-quality semiconductor layer exhibiting high mobility can be formed.

In such primary amides represented by the following formulas [2] to [6], R$_3$ is a C1 to C6 monovalent organic group, and each of R$_4$ to R$_7$ is a hydrogen atom, an amino group (—NH$_2$ group), or a C1 to C4 monovalent organic group. The primary amides having a relatively small number of carbon atoms may be used in the present invention. By use of the primary amide, remaining of carbonaceous impurity in the formed metal oxide semiconductor layer can be prevented, whereby impairment in electric characteristics and the like, which would otherwise be caused by the impurity, can be readily prevented. As used herein, the term "organic group" refers to a group having at least one carbon atom.

[F10]

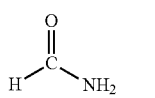

[2]

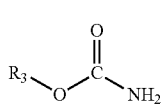

[3]

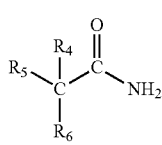

[4]

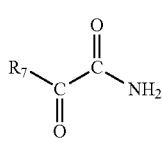

[5]

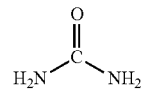

[6]

In the formulas, R$_3$ represents a C1 to C6 monovalent organic group, and each of R$_4$ to R$_7$ is a hydrogen atom, an amino group, or a C1 to C4 monovalent organic group.

Specific examples of the primary amide include the following compounds [A-1] to [A-37]. These primary amides are preferably C1 to C5 compounds.

[F11]

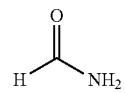

[A-1]

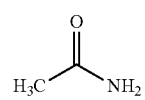

[A-2]

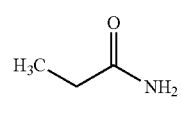

[A-3]

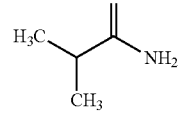

[A-4]

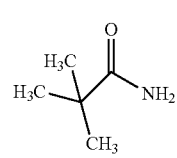

[A-5]

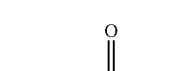

[A-6]

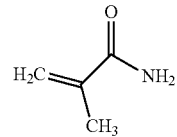

[A-7]

[F12]

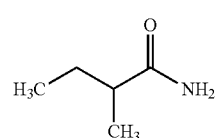

[A-8]

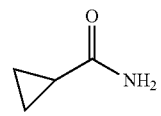

[A-9]

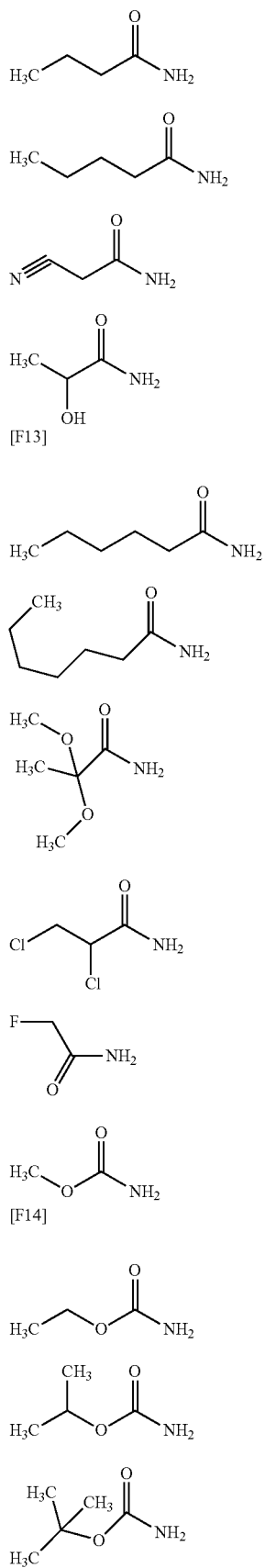
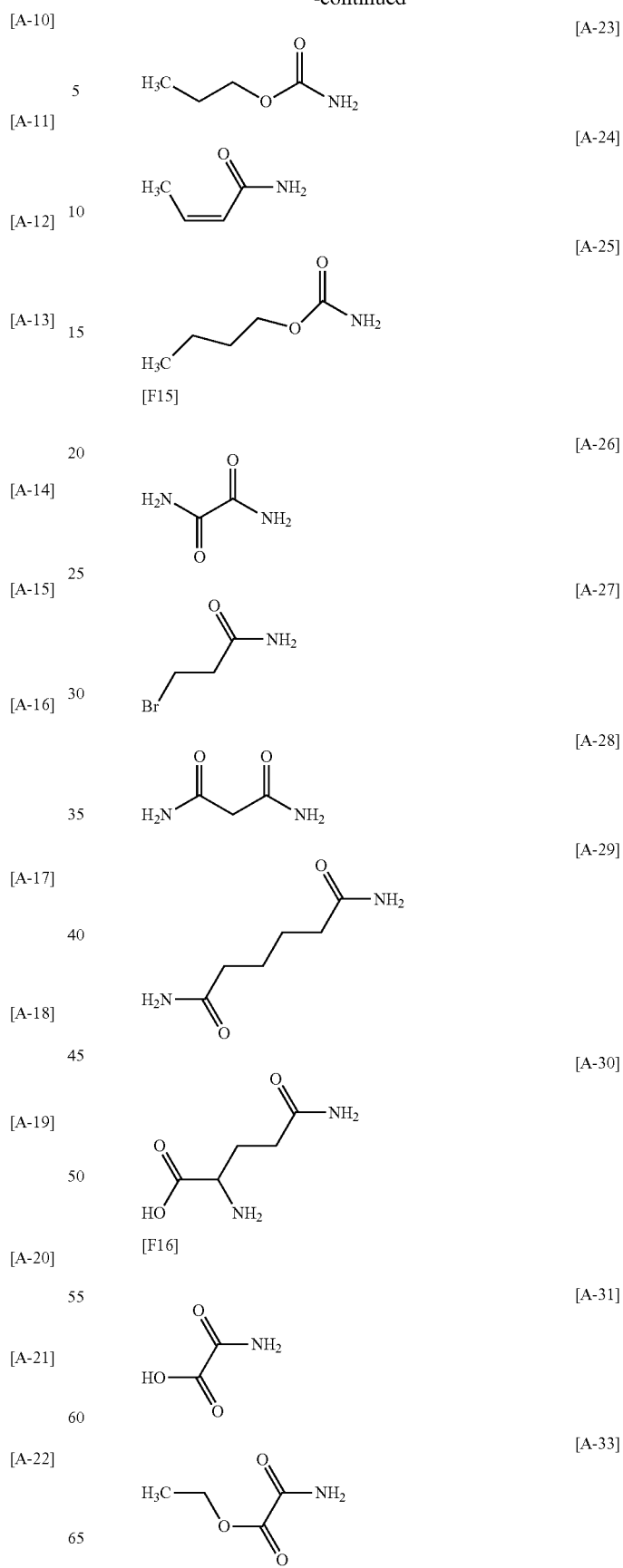

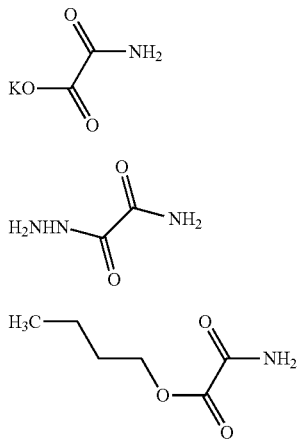

[A-1] is formamide. [A-2] is acetamide. [A-3] is propionamide. [A-4] is isobutanamide. [A-5] is 2,2-dimethylpropanamide. [A-6] is methacrylamide. [A-7] is acrylamide. [A-8] is 2-methylbutanamide. [A-9] is cyclopropanecarbonamide. [A-10] is n-butanamide. [A-11] is n-pentanamide. [A-12] is cyanoacetamide. [A-13] is 2-hydroxypropionamide. [A-14] is n-hexanamide. [A-15] is n-heptanamide. [A-16] is 2,2-dimethoxypropionamide. [A-17] is 2,3-dichloropropionamide. [A-18] is fluoroacetamide. [A-19] is methyl carbamate. [A-20] is ethyl carbamate. [A-21] is isopropyl carbamate. [A-22] is tert-butyl carbamate. [A-23] is n-propyl carbamate. [A-24] is isocrotonamide. [A-25] is n-butyl carbamate. [A-26] is oxalamide. [A-27] is 3-bromopropionamide. [A-28] is malonodiamide. [A-29] is hexanodiamide. [A-30] is glutamine. [A-31] is oxamic acid. [A-33] is ethyl oxamate. [A-34] is potassium oxamate. [A-36] is oxamic acid hydrazide. [A-37] is butyl oxamate.

Preferably, the primary amide contains 1 or 2 carbonyl groups in the molecule thereof, more preferably only one carbonyl group. Also, the primary amide preferably contains 1 or no hydroxyl group (—OH group), more preferably no hydroxyl group. In other words, the primary amide preferably has a small number of highly reactive functional groups that can react with other components contained in the metal oxide semiconductor layer forming composition. As a result, strong coordination of highly reactive functional groups to metal atoms of the metal salt, and occurrence of other phenomena can prevented, whereby remaining of such compounds as impurities in the formed semiconductor layer is prevented.

Thus, examples of preferred primary amides include formamide, methyl carbamate, ethyl carbamate, isopropyl carbamate, tert-butyl carbamate, and urea. Of these, formamide is particularly preferred.

So long as the gist of the present invention is not changed, the primary amide is not limited to the aforementioned examples. The aforementioned primary amide compounds represented by formulas [2] to [5] may be used singly or in combination of two or more species.

The primary amide content of the metal oxide semiconductor layer forming composition is 1 to 1,000 mass %, with respect to the amount of the inorganic metal salt. The primary amide content of the metal oxide semiconductor layer forming composition is preferably 8 to 100 mass %, more preferably 8 to 40 mass %, with respect to the amount of the inorganic metal salt. When the primary amide content satisfies the above conditions, a metal oxide semiconductor layer exhibiting high mobility can be formed.

The metal oxide semiconductor layer forming composition of the present invention is preferably acidic. The pH of the composition is preferably 1 to 3. No particular limitation is imposed on the method of adjusting the pH to 1 to 3. For example, the pH may be adjusted through addition of an acid in an appropriate amount. Examples of the acid include nitric acid, sulfuric acid, phosphoric acid, carbonic acid, boric acid, hydrochloric acid, and hydrofluoric acid.

No particular limitation is imposed on the solid content of the metal oxide semiconductor layer forming composition of the present invention. The solid content may be adjusted to, for example, 0.1 to 30 mass %, 0.3 to 20 mass %, or 0.5 to 15 mass %. The term "solid content" refers to the inorganic metal salt concentration of the metal oxide semiconductor layer forming composition.

No particular limitation is imposed on the method for producing the metal oxide semiconductor layer forming composition of the present invention. In one example, an inorganic metal salt is mixed with the aforementioned solvent represented by formula [1].

The present invention is also directed to a method for producing a metal oxide semiconductor layer, characterized in that the method comprises step (a) of applying the aforementioned metal oxide semiconductor layer forming composition, to thereby form a precursor thin film, and step (b) of firing the precursor thin film at 150° C. to 350° C.

Examples of the substrate onto which the metal oxide semiconductor layer forming composition is applied in step (a) above include a silicon substrate, a metallic substrate, a plastic substrate, a gallium substrate, a transparent electrode substrate, an organic thin film substrate, and a glass substrate. Specific examples thereof include plastic films such as polyimide film, polycarbonate film, poly(ethylene terephthalate) film, and poly(ethylene naphthalate) film; stainless steel foil; and a glass substrate. So long as the gist the present invention is not changed, no particular limitation is imposed on the substrate.

Examples of the application technique which may be employed in the present invention include spin coating, dip coating, screen printing, roller coating, ink-jet coating, die coating, transfer printing, spraying, and slit coating. The thickness of the precursor thin film is 1 to 1,000 nm, preferably 10 to 100 nm. When the thickness satisfies the above conditions, semiconductor devices such as a thin-film transistor (i.e., a type of field-effect transistor) can be suitably produced.

In the present invention, step (b) of firing the precursor thin film at 150° C. to 350° C. is the carried out. The firing temperature is 150° C. to 350° C., preferably 150° C. to 275° C. The step of firing the precursor composition is performed in order to oxidize the inorganic metal salt. No particular limitation is imposed on the firing time, and it is, for example, 3 minutes to 24 hours.

No particular limitation is imposed on the method of heating the precursor composition in the firing step, and generally employable inexpensive heating devices such as a hot plate, an IR furnace, and an oven may be employed. Needless to say, expensive heating devices such as an atmospheric plasma apparatus and a microwave heating device may also be employed. The firing atmosphere may be an oxidizing atmosphere such as air or oxygen, or an inert gas such as nitrogen, helium, or argon.

By use of the metal oxide semiconductor layer forming composition of the present invention, a metal oxide semiconductor layer can be formed through the aforementioned application/firing steps. Therefore, as compared with the case in which a vacuum vapor deposition-mode film forming apparatus is employed (e.g., sputtering), a dense and large-area semiconductor layer exhibiting high mobility can be readily formed by means of a simple device. When a target coating thickness fails to be attained through a single coating/firing procedure, the coating/firing procedure may be repeated so as to attain a target film thickness.

Through the aforementioned steps, a semiconductor layer is formed on the substrate. No particular limitation is imposed on the thickness of the semiconductor layer and it is, for example, 1 to 100 nm, preferably 3 to 15 nm.

Preferably, the production method further includes, between steps (a) and (b), a step of drying the precursor thin film at 120° C. or lower. Through this additional drying step, the formed precursor thin film can be provided with more uniform film thickness. From productivity, the drying temperature is low, preferably 100° C. or lower, more preferably 80° C. or lower. From the viewpoint of drying efficiency, the drying temperature is preferably 40° C. or higher.

The metal oxide semiconductor layer produced through the aforementioned method exhibits excellent semiconductor characteristics, and the electron carrier concentration can be adjusted to $10^{12}$ to $10^{18}/cm^3$. Such an electron carrier concentration may be realized through controlling the composition of the metal oxide (element proportions), compositional proportions, production conditions, etc. Also, the metal oxide semiconductor layer produced according to the present invention can provide a semiconductor device by stacking a conductor layer, an insulating layer, and a semiconductor layer, which are other than the layer of the present invention.

More specifically, an electroluminescent device may be produced from a positive electrode, a hole transporting layer, a light-emitting layer, an electron transporting layer, and a negative electrode as components of interest. A solar cell may be produced from a positive electrode, a p-type joint layer, and a negative electrode as components of interest. A field-effect transistor may be produced from a gate electrode, a gate insulating film, a source electrode, and a drain electrode as components of interest.

Next, a field-effect transistor serving as a semiconductor device employing the metal oxide semiconductor layer of the present invention will be described in detail. FIGS. 1(a) to 1(c) are schematic cross-sections of thin-film transistors 1A to 1C, which are examples of the field-effect transistor of the present invention.

A thin-film transistor 1A shown in FIG. 1(a) has a substrate 2, a gate electrode 3 formed on the substrate 2, a gate insulating film 4 formed on the gate electrode 3, a source electrode 5 and a drain electrode 6 which are stacked on the gate insulating film 4 so as to be electrically insulated from the gate electrode 3, and a semiconductor layer 7 formed on the source electrode 5 and the drain electrode 6. That is, in the thin-film transistor 1A shown in FIG. 1(a), the source electrode 5 and the drain electrode 6 are disposed on the gate insulating film 4, the two electrodes oppositely facing to each other, and the semiconductor layer 7 of the present invention is formed on the source electrode 5 and the drain electrode 6 so as to cover the two electrodes.

A thin-film transistor 1B shown in FIG. 1(b) has the semiconductor layer 7 of the present invention formed on a gate insulating film 4, and a source electrode 5 and a drain electrode 6 which are formed on the semiconductor layer 7.

A thin-film transistor 1C shown in FIG. 1(c) has the semiconductor layer 7 of the present invention formed on a substrate 2, and a source electrode 5 and a drain electrode 6 which are formed so as to partially cover the semiconductor layer 7. A gate insulating film 4 is formed on the semiconductor layer 7, the source electrode 5, and the drain electrode 6, and a gate electrode 3 is disposed on the gate insulating film 4.

The above-described thin-film transistors 1A to 1C exhibit high mobility and have the high-density semiconductor layer 7 of the present invention. Thus, a variety of excellent characteristics including good electrical characteristics are realized. However, the configuration of the thin-film transistor may be modified, so long as the transistor employs the semiconductor layer 7 of the present invention. Thus, the configuration of the parts forming the transistor may be appropriately modified, so long as the gist of the present invention is not changed.

The substrate 2 may be the same as the substrate on which the aforementioned precursor thin film is formed. Examples of the substrate include a silicon substrate, a metallic substrate, a plastic substrate, a gallium substrate, a transparent electrode substrate, an organic thin film substrate, and a glass substrate.

Examples of the material of the electrodes (i.e., the gate electrode 3, the source electrode 5, and the drain electrode 6) which may be used in the invention include metals such as aluminum, gold, silver, copper, molybdenum, and titanium; inorganic materials such as ITO, IZO, carbon black, fullerenes, and carbon nanotube; and organic π-conjugated polymers such as polythiophene, polyaniline, polypyrrole, polyfluorene, and a derivative thereof. These electrode materials may be used singly or in combination of two or more species. The gate electrode 3, the source electrode 5, and the drain electrode 6 may be formed from different electrode materials. In the case where the employed substrate has a function of the gate electrode 3, no gate electrode 3 must be disposed.

The gate insulating film 4 may be an inorganic insulating film such as silicon oxide film, silicon nitride film, aluminum oxide film, hafnium oxide film, or yttrium oxide film; or an organic insulating film such as polyimide film, poly (methyl methacrylate) film, polyvinylphenol film, or benzocyclobutene film. These gate insulating films may be used singly or in combination of two or more species.

These electrodes and the gate insulating film 4 may be formed through sputtering, vacuum vapor deposition, or a similar technique. However, for the purpose of simplifying the production method, various application techniques such as spray coating, printing, and ink jetting may also be employed. When a silicon substrate is employed, the gate insulating film may be formed through thermal oxidation.

The electron carrier concentration of the semiconductor layer 7 may be adjusted to $10^{12}$ to $10^{18}/cm^3$, preferably $10^{13}$ to $10^{18}/cm^3$. Such an electron carrier concentration may be modified through controlling the composition of the metal oxide (element proportions), compositional proportions, production conditions, etc.

Figure 7:
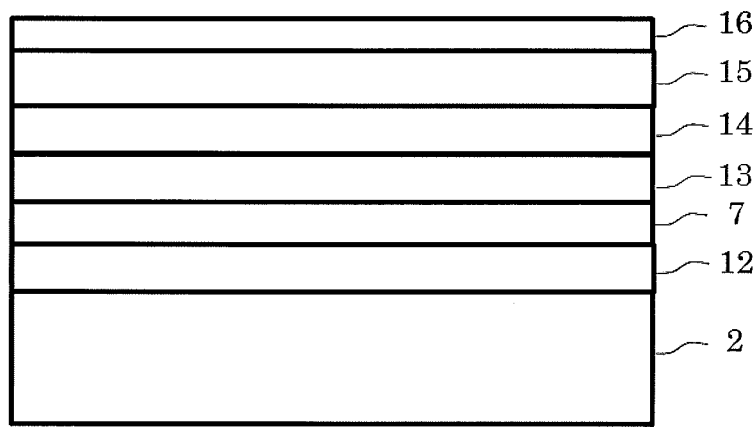
FIG. 7 A schematic cross-section of an electroluminescent device

Next, an electroluminescent device, which is an example of the semiconductor device employing the metal oxide semiconductor layer of the present invention will next be described in detail. FIG. 7 is a schematic cross-section of an organic electroluminescent device, which is a type of electroluminescent device.

The organic electroluminescent device shown in FIG. 7 has a substrate 2, a positive electrode 12 formed on the substrate 2, the semiconductor layer 7 of the present invention formed on the positive electrode 12, a hole transporting layer 13 formed on the semiconductor layer 7, a light-emitting layer 14 formed on the hole transporting layer 13, an electron transporting layer 15 formed on the light-emitting layer 14, and a negative electrode 16 formed on the electron transporting layer 15. The same substrate 2 as employed in the thin-film transistor may also be used. The positive electrode 12 and the negative electrode 16 may be formed of the same electrode materials as employed in the thin-film transistor. For passage of the emitted light, either the positive electrode or the negative electrode of the organic electroluminescent device is transparent or translucent (semi-transparent). The hole transporting layer 13 may be formed of any organic material having electron-donating property. Specific examples thereof include a triazole derivative, an oxadiazole derivative, an imidazole derivative, a carbazole derivative, an indolocarbazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline copolymer, and an oligomer having conducting property (in particular, a thiophene oligomer). The light-emitting layer 14 may be formed of a material selected from various materials known in patent documents and other documents. Examples of the material of the electron transporting layer 15 include an aluminum complex, a nitro-substituted fluorene derivative, a diphenylquinone derivative, a thiopyranedioxide derivative, a carbodiimide, a fluorenylidenemethane derivative, an anthraquinonedimethane derivative, an anthrone derivative, and an oxadiazole derivative.

In order to improve characteristics of the semiconductor device, an injection layer or a blocking layer may be inserted between component layers. When the layer thickness of each layer is excessively small, difficulty is encountered in uniformly forming a film, whereas when the thickness is excessively large, carrier transportation is impeded. Thus, the thickness is preferably 5 to 500 nm. Alternatively, the semiconductor layer 7 may be converted to a conductor through high-temperature heat treatment or the like.

The present invention is also directed to a method for producing a metal oxide conductor layer, which method comprises, after step (a) of applying the metal oxide semiconductor layer forming composition, to thereby form a precursor thin film, and step (b) of firing the precursor thin film at 150° C. to 350° C., step (c) of firing a metal oxide semiconductor layer at a temperature higher than 350° C. and 600° C. or lower, to thereby convert the metal oxide semiconductor layer to a metal oxide conductor layer.

No particular limitation is imposed on the method of firing at a temperature higher than 350° C. and 600° C. or lower in step (c), and generally employable inexpensive heating devices such as a hot plate, an IR furnace, and an oven may be employed. Needless to say, expensive heating devices such as an atmospheric plasma apparatus and a microwave heating device may also be employed. The firing atmosphere may be an oxidizing atmosphere such as air or oxygen, or an inert gas such as nitrogen, helium, or argon. No particular limitation is imposed on the firing time, and it is, for example, 3 minutes to 24 hours.

In the present invention, when a metal oxide conductor layer is produced through steps (a) and (b) and subsequent step (c), the precursor thin film is preferably dried at 120° C. or lower between steps (a) and (b). Through the drying step, the formed precursor thin film can be provided with more uniform film thickness. From productivity, the drying temperature is low, preferably 100° C. or lower, more preferably 80° C. or lower. From the viewpoint of drying efficiency, the drying temperature is preferably 40° C. or higher.

EXAMPLES

<Fabrication of Thin-Film Transistor and Measurement of Mobility>

Whether or not the film produced from the metal oxide semiconductor layer forming composition of the present invention assumes a semiconductor layer was confirmed. Also, the mobility of the film was determined. The evaluation was performed by use of a thin-film transistor 1D (FIG. 2) having a semiconductor layer formed from the composition.

Specifically, a metal oxide semiconductor layer 7 was formed on a thermally oxidized film ($SiO_2$, gate insulating film 4) disposed on a p-type silicon substrate 2 (resistance: 0.02 Ωcm). A titanium electrode (100 nm) was formed on the metal oxide semiconductor layer 7. More specifically, the titanium electrode was formed on the metal oxide semiconductor layer 7 through a deposition (sputtering) process via a shadow mask. The thus-formed titanium film electrode provided a source electrode 5 and a drain electrode 6 of the thin-film transistor 1D. The thin-film transistor 1D had a channel length of 90 μm and a channel width of 2 mm. The gate insulating film 4 had a dielectric constant of 3.9 and a film thickness of 200 nm. Notably, the substrate 2 also served as a gate electrode.

The mobility of the metal oxide semiconductor was calculated based on a conducting characteristic of the thus-fabricated thin-film transistor 1D. The conducting characteristic was determined by means of a semiconductor parameter analyzer HP4156C (product of Agilent Technologies). In order to reduce an adverse effect due to noise, the thin-film transistor 1D was placed in a sealed case. The inside of the sealed case was maintained at atmospheric pressure, 23±3° C., and a humidity of 40±10%.

Figure 2:
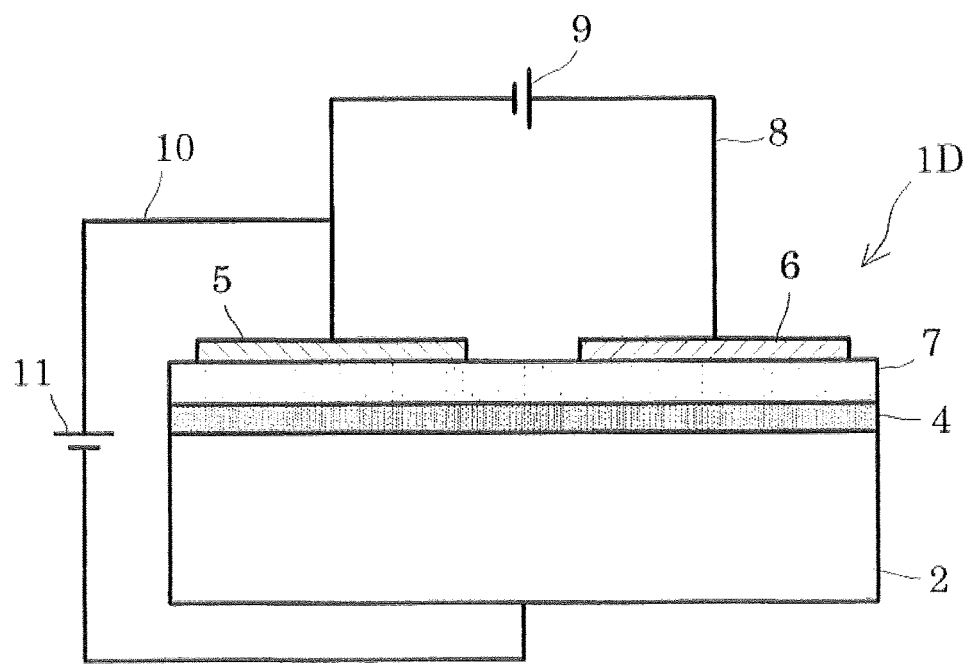
FIG. 2 Schematic cross-section of thin-film transistors 1D
Figure 3:
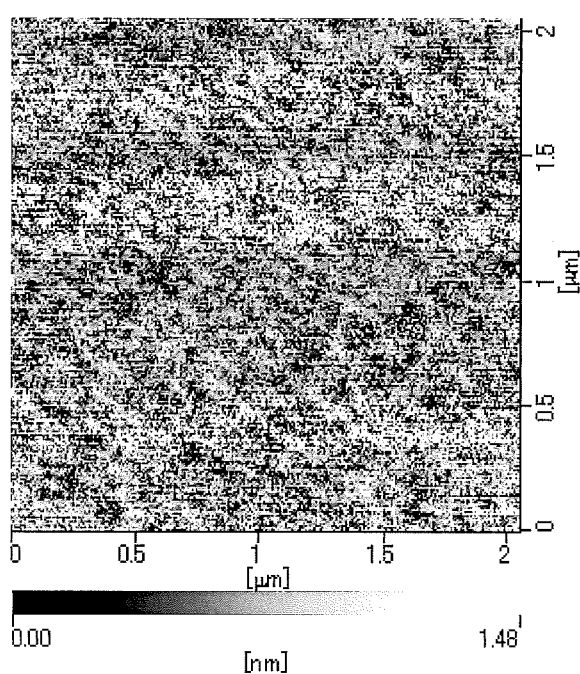
FIG. 3 AFM image of film of Example 4 (shape image)
Figure 4:
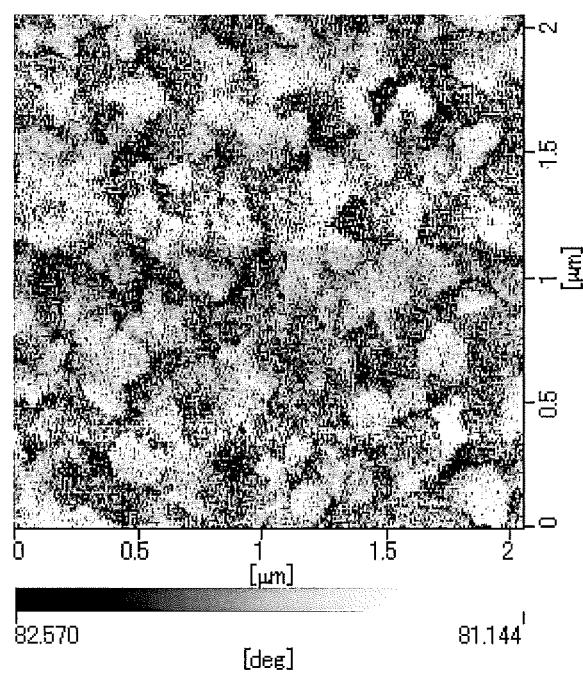
FIG. 4 AFM image of film of Example 4 (phase image)
Figure 5:
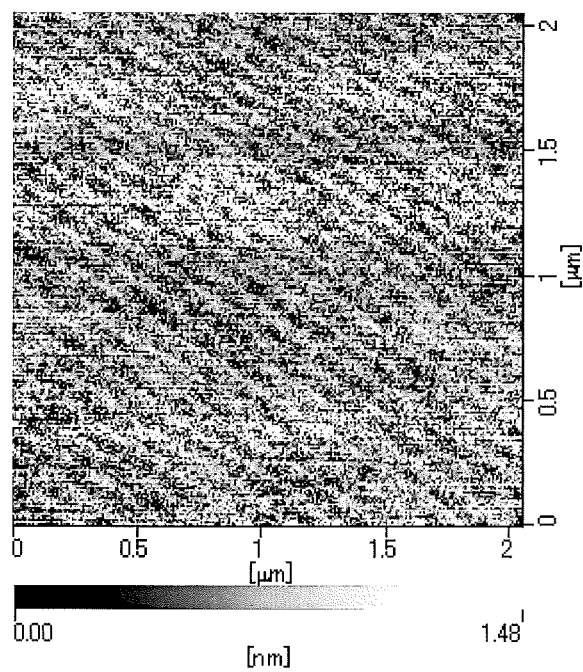
FIG. 5 AFM image of film of Comparative Example 3 (shape image)
Figure 6:
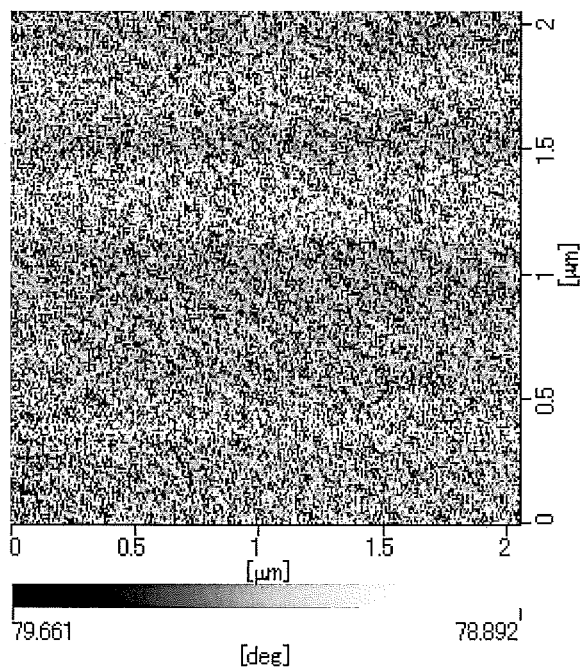
FIG. 6 AFM image of film of Comparative Example 3 (phase image)

In the thin-film transistor 1D shown in FIG. 2, a wiring 8 which electrically connects the source electrode 5 to the drain electrode 6 was provided with a power source 9 for applying a drain voltage VD. A wiring 10 which electrically connects the source electrode 5 to the p-type substrate 2 was provided with a power source 11 for applying a gate voltage VG. The gate voltage VG was swept from −30 V to +30 V stepwise by 1 V. When the drain voltage VD was set to +20 V, an increase in current (i.e., conducting characteristic) flowing between the source electrode 5 and the drain electrode 6 (i.e., drain current) ID was determined.

Generally, the drain current ID in a saturation state is represented by the following equation. The mobility (μ) of the metal oxide semiconductor can be obtained from the slope of a graph with the square root of absolute values of drain current ID plotted along the vertical axis, and gate voltages VG plotted along the horizontal axis. In the present invention, mobility was calculated by the following equation:

[F1]

$$ID = WC\mu(VG-VT)^2/2L \qquad (1)$$

(wherein W represents a channel width of transistor; L represents a channel length of transistor; C represents a capacitance density; and VT represents a threshold voltage).

<Assessment of Film Formability (Assessment of Pinhole Generation)>

Onto a low-resistance silicon substrate provided with a thermally oxidized film (25 mm×25 mm), a metal oxide semiconductor layer forming composition which had been caused to pass through a 0.2-μm polytetrafluoroethylene filter was applied through spin coating, so that the thickness of the cured film was adjusted to 9 nm. The thus-formed thin film was allowed to stand for 30 seconds and then heated at 60° C. for 5 minutes by means of a hot plate, to thereby convert the film to a metal oxide semiconductor layer precursor film. Finally, the precursor film was heated at 300° C. for 60 minutes by means of a hot plate, to thereby form a cured film. The surface of the cured film was observed under an optical microscope (×100). When pinholes were observed in the film surface, the case was rated with "X," whereas when no pinhole was observed in the film surface, the case was rated with "O."

<Method of Determining the Thickness of Cured Film>

Onto a silicon substrate (¼ of 4-inch silicon wafer), a metal oxide semiconductor layer forming composition which had been caused to pass through a 0.2-μm polytetrafluoroethylene filter was applied through spin coating. The thus-formed thin film was heated at 60° C. for 5 minutes by means of a hot plate, to thereby convert the film to a metal oxide semiconductor layer precursor film. Finally, the precursor film was heated at 300° C. for 60 minutes by means of a hot plate, to thereby form a cured film. The thickness of the cured film was determined through spectroscopic ellipsometry.

<Assessment of Flatness (Ra)>

The flatness of the cured film was assessed through atomic force microscopy (AFM). Each of the semiconductor layers of the thin-film transistor fabricated in the Examples and Comparative Examples was observed under an atomic force microscope, and a shape image was obtained by scanning a 2 μm×2 μm area. Then, arithmetic average roughness (Ra) was calculated. The flatness of the semiconductor layer was evaluated by the arithmetic average roughness (Ra). A phase image was also monitored simultaneously with measuring the shape image. Meanwhile, the Ra of a low-resistance silicon substrate which was provided with a thermally oxidized film and no semiconductor layer was found to be 0.26 nm or less (measurement apparatus: L-trace probe microscope (product of ISI Nanotechnology)).

[Method of Preparing Compositions 1 to 6]

Aqueous indium(III) nitrate (29.7 mass %) and gallium (III) nitrate 2.77-hydrate were completely dissolved in deionized water (DIW), and an organic solvent was added to the solution. The thus-obtained mixture was sufficiently stirred, to thereby yield metal oxide semiconductor layer forming compositions 1 to 6 (hereinafter referred to simply as compositions 1 to 6). Table 1 shows the amounts of the used ingredients. The metal atomic ratio In:Ga was 93:7.

Example 1

Onto a low-resistance silicon substrate provided with a thermally oxidized film (25 mm×25 mm), composition 1 which had been caused to pass through a 0.2-μm polytetrafluoroethylene filter was applied through spin coating, so that the thickness of the cured film was adjusted to 9 nm. The thus-formed thin film of composition 1 was heated at 60° C. for 5 minutes by means of a hot plate, to thereby convert the film to a metal oxide semiconductor layer precursor film. Subsequently, in order to remove possible impurity in the film, the metal oxide semiconductor layer precursor film was subjected to UV ozone treatment by means of a UV ozonizer (product of SEN LIGHTS CORPORATION). The employed light source was PL 2003N-10, and the power source was UE 2003N-7. Finally, the precursor film was heated at 300° C. for 60 minutes by means of a hot plate, to thereby form a cured film. The thus-obtained cured film was found to have an Ra of 0.28 nm, which is an excellent value. By use of the cured film, a thin-film transistor was fabricated according to the aforementioned procedure of forming a thin-film transistor. The cured film exhibited an n-type semiconductor property, indicating that the film was a metal oxide semiconductor layer. The mobility was as high as 7.5 cm$^2$/Vs. For pinhole assessment, a cured film sample for pinhole assessment was prepared by use of composition 1 according to the aforementioned procedure of evaluating film formability. As is clear from Table 2, no pinhole was observed.

Example 2

The procedure of Example 1 was repeated, except that composition 2 was used, to thereby yield a cured film. The thus-obtained cured film was found to have an excellent Ra of 0.28 nm and a high mobility of 6.7 cm$^2$/Vs.

Example 3

The procedure of Example 1 was repeated, except that composition 3 was used, to thereby yield a cured film.

Example 4

Onto a low-resistance silicon substrate provided with a thermally oxidized film (25 mm×25 mm), composition 1 which had been caused to pass through a 0.2-μm polytetrafluoroethylene filter was applied through spin coating, so that the thickness of the cured film was adjusted to 9 nm. The thus-formed thin film of composition 1 was heated at 60° C. for 5 minutes by means of a hot plate, to thereby convert the film to a metal oxide semiconductor layer precursor film. Then, the precursor film was heated at 300° C. for 60

TABLE 1

|  | Aq. In(III) nitrate (g) | Ga(III) nitrate 2.77H$_2$O (g) | DPM (g) | PGME (g) | 3-Methoxy-1-butanol (g) | EG (g) | Deionized water (g) |
|---|---|---|---|---|---|---|---|
| Compn. 1 | 1.7088 | 0.0388 | 12.75 | — | — | — | 0.5 |
| Compn. 2 | 1.7088 | 0.0388 | 1.62 | — | 11.25 | — | 0.38 |
| Compn. 3 | 1.7088 | 0.0388 | 1.62 | 11.25 | — | — | 0.38 |
| Compn. 4 | 1.7088 | 0.0388 | — | 12.75 | — | — | 0.5 |
| Compn. 5 | 1.7088 | 0.0388 | — | — | 12.75 | — | 0.5 |
| Compn. 6 | 1.7088 | 0.0388 | — | — | — | 12.75 | 0.5 |

DPM: dipropylene glycol monomethyl ether
PGME: propylene glycol monomethyl ether
EG: ethylene glycol minutes by means of a hot plate, to thereby form a cured film. The thus-obtained cured film was found to have an Ra of 0.27 nm, which is an excellent value. By use of the cured film, a thin-film transistor was fabricated according to the aforementioned procedure of forming a thin-film transistor. The cured film exhibited an n-type semiconductor property, indicating that the film was a metal oxide semiconductor layer. The mobility was as high as 6.7 cm$^2$/Vs. For pinhole assessment, a cured film sample for pinhole assessment was prepared by use of composition 1 according to the aforementioned procedure of evaluating film formability. As a result, the formed cured film was found to be flat with no pinhole.

Comparative Example 1

The procedure of Example 1 was repeated, except that composition 4 was used, to thereby yield a cured film. The thus-obtained cured film was found to have a mobility of 6.5 cm$^2$/Vs, but was found to have pinholes in the film surface. In addition, the Ra was as bad as 0.59 nm, thereby failing to form a flat film. Thus, composition 4 is not suited for use in practice.

Comparative Example 2

The procedure of Example 1 was repeated, except that composition 5 was used, to thereby yield a cured film. The thus-obtained cured film was found to have pinholes in the film surface. In addition, the Ra was as considerably bad as 1.72 nm, thereby failing to form a flat film. The mobility was as bad as 3.3 cm$^2$/Vs. Thus, composition 5 is not suited for use in practice.

Comparative Example 3

The procedure of Example 4 was repeated, except that composition 6 was used, to thereby yield a cured film. The thus-obtained cured film was found to have no pinhole, thereby successfully forming a flat film. However, the mobility was as bad as 4.1 cm$^2$/Vs.

TABLE 2

|  | Ex. 1 | Ex. 2 | Ex. 3 | Comp. Ex. 1 | Comp. Ex. 2 |
| --- | --- | --- | --- | --- | --- |
| Composition | Compn. 1 | Compn. 2 | Compn. 3 | Compn. 4 | Compn. 5 |
| Organic solvent | DPM | 3M1B/DPM | PGME/DPM | PGME | 3M1B |
| Pinhole (microscopic) | ○ | ○ | ○ | X | X |
| Flatness Ra (nm) | 0.28 | 0.28 | 0.34 | 0.59 | 1.72 |
| Mobility (cm$^2$/Vs) | 7.5 | 6.7 | 6.3 | 6.5 | 3.3 |

3M1B: 3-methoxy-1-butanol

As is clear from the results of Examples 1 to 3, films formed from the metal oxide semiconductor layer forming composition of the present invention containing a specific dipropylene glycol monomethyl ether were found to have no pinhole and have a considerably high flatness with an Ra of 0.28 nm and 0.34 nm. The composition of Example 2 contains the composition of Comparative Example 2 with 10.8 mass % dipropylene glycol monomethyl ether. In this case, the Ra was remarkably improved from 1.72 nm to 0.28 nm, and the mobility was also considerably improved. Thus, the metal oxide semiconductor layer forming composition of the present invention can greatly improve film characteristics, to thereby provide a high-performance semiconductor film.

TABLE 3

|  | Example 4 | Comp. Ex. 3 |
| --- | --- | --- |
| Composition | Composition 1 | Composition 6 |
| Organic solvent | DPM | EG |
| Pinhole (microscopic) | ○ | ○ |
| Thickness (nm) | 9 | 9 |
| Flatness Ra (nm) | 0.27 | 0.27 |
| Mobility (cm$^2$/Vs) | 6.7 | 4.1 |

<AFM Measurement>

FIGS. 3 to 6 are shape images and phase images of the surfaces of the films of Example 4 and Comparative Example 3. The film of Example 4 was very flat as observed in the shape image, but some phase gradation was observed in the phase image. Since the phase observed in AFM is thought to vary depending on the hardness and absorption capacity of the observed film, the film of Example 4 seems to have different site-specific surface characteristics. In consideration that the film is formed of InGaO and that the film of Example 4 has high mobility, the gradation in the phase image is conceivably attributed to the difference in crystallinity. In contrast, the phase image of the film of Comparative Example 3 had no gradation. That is, ethylene glycol used in Comparative Example 3, having high polarity, readily remains in the film, as compared with dipropylene glycol monomethyl ether used in Example 4. Conceivably, curing (crystallization) of the film may be impeded.

When the metal oxide semiconductor layer forming composition of the present invention is used, remaining of organic solvent is prevented in the film as an impurity, whereby a semiconductor layer having suitable crystallinity can be formed.

Method of Preparing Compositions 7 and 8

Aqueous indium(III) nitrate (29.7 mass %) and aqueous zinc(II) nitrate (37.9 mass %) were completely dissolved in deionized water (DIW), and an organic solvent was added to the solution. The thus-obtained mixture was sufficiently stirred, to thereby yield metal oxide semiconductor layer forming compositions 7 and 8 (hereinafter referred to simply as compositions 7 and 8). Table 4 shows the amounts of the used ingredients.

TABLE 4

|  | Metal at. ratio (In:Zn) | Aq. In(III) nitrate (g) | Aq. Zn(II) nitrate (g) | DPM (g) | Deionized water (g) |
| --- | --- | --- | --- | --- | --- |
| Compn. 7 | 93:7 | 1.7359 | 0.0645 | 12 | 1.2 |
| Compn. 8 | 77:23 | 1.5304 | 0.2255 | 12 | 1.2 |

Example 5

Onto a low-resistance silicon substrate provided with a thermally oxidized film (25 mm×25 mm), composition 7 which had been caused to pass through a 0.2-μm polytetrafluoroethylene filter was applied through spin coating, so that the thickness of the cured film was adjusted to 9 nm. The thus-formed thin film of composition 7 was heated at 60° C. for 5 minutes by means of a hot plate, to thereby convert the film to a metal oxide semiconductor layer precursor film. Subsequently, in order to remove possible impurity in the film, the metal oxide semiconductor layer precursor film was subjected to UV ozone treatment by means of a UV ozonizer (product of SEN LIGHTS CORPORATION). The employed light source was PL 2003N-10, and the power source was UE 2003N-7. Finally, the precursor film was heated at 300° C. for 60 minutes by means of a hot plate, to thereby form a cured film. By use of the cured film, a thin-film transistor was fabricated according to the aforementioned procedure of forming a thin-film transistor. The cured film exhibited an n-type semiconductor property, indicating that the film was a metal oxide semiconductor layer.

Example 6

The procedure of Example 5 was carried out, to thereby form a cured film. The cured film was subjected to a heat treatment at 400° C. for 60 minutes by means of a hot plate. By use of the thus-produced cured film, a thin-film transistor was fabricated according to the aforementioned procedure of forming a thin-film transistor. The cured film failed to serve as a semiconductor, but the film was found to be a conductor layer exhibiting high conductivity. Consequently, the metal oxide semiconductor layer of the present invention was found to be transformed into a conductor layer through high-temperature treatment.

Example 7

The procedure of Example 5 was carried out, to thereby form a cured film. The cured film was subjected to a heat treatment at 500° C. for 60 minutes by means of a hot plate. By use of the thus-produced cured film, a thin-film transistor was fabricated according to the aforementioned procedure of forming a thin-film transistor. The cured film failed to serve as a semiconductor, but the film was found to be a conductor layer exhibiting high conductivity. Consequently, the metal oxide semiconductor layer of the present invention was found to be transformed into a conductor layer through high-temperature treatment.

Example 8

The procedure of Example 5 was repeated, except that composition 8 was used, to thereby form a cured film. By use of the thus-produced cured film, a thin-film transistor was fabricated according to the aforementioned procedure of forming a thin-film transistor. The cured film exhibited an n-type semiconductor property, indicating that the film was a metal oxide semiconductor layer.

Example 9

The procedure of Example 5 was repeated, except that composition 8 was used, to thereby form a cured film. The cured film was subjected to a heat treatment at 400° C. for 60 minutes by means of a hot plate. By use of the thus-produced cured film, a thin-film transistor was fabricated according to the aforementioned procedure of forming a thin-film transistor. The cured film failed to serve as a semiconductor, but the film was found to be a conductor layer exhibiting high conductivity. Consequently, the metal oxide semiconductor layer of the present invention was found to be transformed into a conductor layer through high-temperature treatment.

Example 10

The procedure of Example 5 was repeated, except that composition 8 was used, to thereby form a cured film. The cured film was subjected to a heat treatment at 500° C. for 60 minutes by means of a hot plate. By use of the thus-produced cured film, a thin-film transistor was fabricated according to the aforementioned procedure of forming a thin-film transistor. The cured film failed to serve as a semiconductor, but the film was found to be a conductor layer exhibiting high conductivity. Consequently, the metal oxide semiconductor layer of the present invention was found to be transformed into a conductor layer through high-temperature treatment.

TABLE 5

| | Compositions | Time & temp. of firing cured film | Type of cured film |
|---|---|---|---|
| Ex. 5 | Compn. 7 | 300° C. × 60 min | semiconductor |
| Ex. 6 | Compn. 7 | 300° C. × 60 min 400° C. × 60 min | conductor |
| Ex. 7 | Compn. 7 | 300° C. × 60 min 500° C. × 60 min | conductor |
| Ex. 8 | Compn. 8 | 300° C. × 60 min | semiconductor |
| Ex. 9 | Compn. 8 | 300° C. × 60 min 400° C. × 60 min | conductor |
| Ex. 10 | Compn. 8 | 300° C. × 60 min 500° C. × 60 min | conductor |

DESCRIPTION OF REFERENCE NUMERALS

1A, 1B, 1C, 1D thin-film transistor
2 substrate
3 gate electrode
4 gate insulating film
5 source electrode
6 drain electrode
7 semiconductor layer (metal oxide semiconductor layer)
8, 10 wiring
9, 11 power source
12 positive electrode
13 hole transporting layer
14 light-emitting layer
15 electron transporting layer
16 negative electrode

The invention claimed is:

1. A metal oxide semiconductor layer forming composition, characterized by comprising a solvent represented by formula [1]:

[F1]

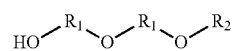

[1]

(wherein $R_1$ represents a C2 to C3 linear or branched alkylene group, and $R_2$ represents a C1 to C3 linear or branched alkyl group) and an inorganic metal salt.

2. A metal oxide semiconductor layer forming composition according to claim 1, wherein the inorganic metal salt is an indium inorganic salt.

3. A metal oxide semiconductor layer forming composition according to claim 2, wherein the inorganic metal salt is indium nitrate.

4. A metal oxide semiconductor layer forming composition according to claim 1, wherein the solvent represented by formula [1] is at least one species selected from the group consisting of dipropylene glycol monomethyl ether, dipropylene glycol monoethyl ether, and dipropylene glycol monopropyl ether.

5. A metal oxide semiconductor layer forming composition according to claim 1, which contains the solvent represented by formula [1] in an amount of 1 to 39 mass %.

6. A metal oxide semiconductor layer forming composition according to claim 1, which contains a primary amide in an amount of 1 to 1,000 mass %, with respect to the amount of the inorganic metal salt.

7. A method for producing a metal oxide semiconductor layer, the method comprising step (a) of applying a metal oxide semiconductor layer forming composition as recited in claim 1, to thereby form a precursor thin film, and step (b) of firing the precursor thin film at 150° C. to 350° C.

8. A metal oxide semiconductor layer production method according to claim 7, wherein the method further includes, between steps (a) and (b), a step of drying the precursor thin film at 120° C. or lower.

9. A metal oxide semiconductor layer produced through a metal oxide semiconductor layer production method as recited in claim 7.

10. A metal oxide semiconductor layer produced through a metal oxide semiconductor layer production method as recited in claim 8.

11. A semiconductor device having a metal oxide semiconductor layer as recited in claim 9.

12. A semiconductor device having a metal oxide semiconductor layer as recited in claim 10.

13. A field-effect transistor having at least a substrate, a semiconductor layer, a source electrode, and a drain electrode, wherein the semiconductor layer is a metal oxide semiconductor layer as recited in claim 9.

14. A field-effect transistor having at least a substrate, a semiconductor layer, a source electrode, and a drain electrode, wherein the semiconductor layer is a metal oxide semiconductor layer as recited in claim 10.

15. A method for producing a metal oxide conductor layer, which method comprises, after steps (a) and (b) as recited in claim 7, step (c) of firing a metal oxide semiconductor layer at a temperature higher than 350° C. and 600° C. or lower, to thereby convert the metal oxide semiconductor layer to a metal oxide conductor layer.

16. A metal oxide conductor layer production method according to claim 15, which method further includes, between steps (a) and (b), a step of drying the precursor thin film at 120° C. or lower.

* * * * *